(12) United States Patent
Farlow et al.

(10) Patent No.: US 8,466,546 B2
(45) Date of Patent: Jun. 18, 2013

(54) CHIP-SCALE PACKAGE

(75) Inventors: Andy Farlow, West Sussex (GB); Mark Pavier, West Sussex (GB); Andrew N. Sawle, West Sussex (GB); George Pearson, West Sussex (GB); Martin Standing, Kent (GB)

(73) Assignee: International Rectifier Corporation, El Segundo, CA (US)

( * ) Notice: Subject to any disclaimer, the term of this patent is extended or adjusted under 35 U.S.C. 154(b) by 1067 days.

(21) Appl. No.: 11/409,298

(22) Filed: Apr. 21, 2006

(65) Prior Publication Data

US 2006/0249836 A1 Nov. 9, 2006

Related U.S. Application Data

(60) Provisional application No. 60/674,390, filed on Apr. 22, 2005.

(51) Int. Cl.
H01L 23/48 (2006.01)

(52) U.S. Cl.
USPC .... 257/688; 257/689; 257/696; 257/E23.005; 257/E23.015; 257/E23.041

(58) Field of Classification Search
USPC ............... 257/678, 724, 725, 726, 734, 738, 257/704, 706, 720, 675, 688, 689, 696, E23.005, E23.015, E23.041
See application file for complete search history.

(56) References Cited

U.S. PATENT DOCUMENTS

| | | | |
|---|---|---|---|
| 3,561,107 A | 2/1971 | Best, et al. |
| 3,871,014 A | 3/1975 | King et al. |
| 3,972,062 A | 7/1976 | Hopp |
| 4,021,838 A | 5/1977 | Warwick |
| 4,392,151 A | 7/1983 | Iwatani |
| 4,454,454 A | 6/1984 | Valentine |
| 4,604,644 A | 8/1986 | Beckham et al. |
| 4,639,760 A | 1/1987 | Granberg et al. |
| 4,646,129 A | 2/1987 | Yerman et al. |
| 5,075,759 A | 12/1991 | Moline |
| 5,182,632 A | 1/1993 | Bechtel et al. |
| 5,217,922 A | 6/1993 | Akasaki et al. |
| 5,311,402 A | 5/1994 | Kobayashi et al. |
| 5,313,366 A | 5/1994 | Gaudenzi et al. |
| 5,367,435 A | 11/1994 | Andros et al. |
| 5,371,404 A | 12/1994 | Juskey et al. |
| 5,381,039 A | 1/1995 | Morrison |
| 5,394,490 A | 2/1995 | Kato et al. |

(Continued)

FOREIGN PATENT DOCUMENTS

| EP | 0 966 038 | 12/1999 |
| EP | 0 978 871 | 2/2000 |

(Continued)

OTHER PUBLICATIONS

Mosfet BGA Design Guide 2004, Fairchild Semiconductor.

(Continued)

*Primary Examiner* — Ngan Ngo
(74) *Attorney, Agent, or Firm* — Farjami & Farjami LLP

(57) ABSTRACT

A semiconductor package including a conductive clip preferably in the shape of a can, a semiconductor die, and a conductive stack interposed between the die and the interior of the can which includes a conductive platform and a conductive adhesive body.

19 Claims, 6 Drawing Sheets

U.S. PATENT DOCUMENTS

| | | | |
|---|---|---|---|
| 5,397,921 | A | 3/1995 | Karnezos |
| 5,447,886 | A | 9/1995 | Rai |
| 5,448,114 | A | 9/1995 | Kondoh et al. |
| 5,454,160 | A | 10/1995 | Nickel |
| 5,455,456 | A | 10/1995 | Newman |
| 5,477,087 | A | 12/1995 | Kawakita et al. |
| 5,510,758 | A | 4/1996 | Fujita et al. |
| 5,512,786 | A | 4/1996 | Imamura et al. |
| 5,532,512 | A | 7/1996 | Fillion et al. |
| 5,554,887 | A | 9/1996 | Sawai et al. |
| 5,578,869 | A | 11/1996 | Hoffman et al. |
| 5,654,590 | A | 8/1997 | Kuramochi |
| 5,703,405 | A | 12/1997 | Zeber |
| 5,726,489 | A | 3/1998 | Matsuda et al. |
| 5,726,501 | A | 3/1998 | Matsubara |
| 5,726,502 | A | 3/1998 | Beddingfield |
| 5,729,440 | A | 3/1998 | Jimarez et al. |
| 5,734,201 | A | 3/1998 | Djennas et al. |
| 5,739,585 | A | 4/1998 | Akram et al. |
| 5,814,894 | A | 9/1998 | Igarashi et al. |
| 5,841,183 | A | 11/1998 | Ariyoshi |
| 6,051,888 | A | 4/2000 | Dahl |
| 6,133,634 | A | 10/2000 | Joshi |
| 6,262,489 | B1 | 7/2001 | Koors et al. |
| 6,303,974 | B1 | 10/2001 | Irons et al. |
| 6,391,687 | B1 | 5/2002 | Cabahug et al. |
| 6,720,647 | B2 | 4/2004 | Fukuizumi |
| 6,744,124 | B1 | 6/2004 | Chang et al. |
| 2001/0048116 | A1 | 12/2001 | Standing et al. |
| 2002/0114726 | A1* | 8/2002 | Soga et al. ............... 420/557 |
| 2005/0029588 | A1* | 2/2005 | Sakamoto et al. .......... 257/330 |

FOREIGN PATENT DOCUMENTS

| | | |
|---|---|---|
| JP | 01132142 | 5/1989 |
| JP | 5-129516 | 5/1993 |
| JP | 07-202064 | 4/1995 |
| JP | 11-054673 | 2/1999 |
| JP | 11195680 | 7/1999 |
| JP | 2000/012748 | 1/2000 |
| JP | 2000-243887 | 8/2000 |
| JP | 2003-234447 | 8/2003 |
| JP | 2004/500720 | 1/2004 |
| JP | 2004-500720 | 1/2004 |
| WO | WO 99/65077 | 12/1999 |

OTHER PUBLICATIONS

Webster's Ninth New Collegiate Dictionary, (definition for the word "on"), p. 823.

* cited by examiner

US 8,466,546 B2

CHIP-SCALE PACKAGE

RELATED APPLICATION

This application is based on and claims the benefit of U.S. Provisional Application Ser. No. 60/674,390, filed on Apr. 22, 2005, entitled SEMICONDUCTOR PACKAGE, to which a claim of priority is hereby made and the disclosure of which is incorporated by reference.

BACKGROUND OF THE INVENTION

The present invention relates to power semiconductor packages.

Referring to FIGS. 1-7, a package 10 according to the prior art includes a conductive can 12, and a power semiconductor die 14. Can 12 is typically formed with an electrically conductive material such as copper or a copper-based alloy, and may be coated with silver, gold or the like. Die 14 may be a vertical conduction type power semiconductor MOSFET having its drain electrode 16 electrically and mechanically attached to an interior surface of can 12 by a conductive adhesive 18 such as solder or a conductive epoxy (e.g. silver epoxy). Source electrode 20, and gate electrode 22 of die 14 (which are disposed on a surface opposite to the drain electrode) each includes a solderable body which facilitates its direct connection to a respective conductive pad 24, 26 of a circuit board 28 by a conductive adhesive (e.g. solder or conductive epoxy) as illustrated by FIG. 8. Note that die 14 further includes passivation body 30 which partially covers source electrode 20 and gate electrode 22, but includes openings to allow access at least to the solderable portions thereof for electrical connection. Further, note that in package 10 conductive can 12 includes web portion 13 (to which die 14 is electrically and mechanically connected), wall 15 surrounding web portion 13, and two oppositely disposed rails 32 extending from wall 15 each configured for connection to a respective conductive pad 34 on circuit board 28. Die 14 is spaced from wall 13 of can 12; i.e. wall 13 surrounds die 14.

In a package according to the prior art, source electrode 20, and gate electrode 22 are soldered down by the user. Specifically, the user applies solder to, for example, the pads of a circuit board, and the electrodes of the die are attached to the pads by the solder so placed.

SUMMARY OF THE INVENTION

In the recent years, thin die have emerged as desirable candidates for power applications. Some thin die are only about 250 μm or less thick. Thus, a can 12 for accommodating a die so thin may be difficult to devise.

According to the present invention, a stack is interposed between a power electrode of the die and the interior surface of the can so that a thin die may be received in the interior of a can having an interior deeper than the thickness of the die.

A package according to the present invention, therefore, includes a conductive clip, which is preferably shaped like can 12 of the prior art package, a power semiconductor die including a first power electrode on a first surface thereof and a second power electrode disposed on an opposite surface thereof, and a conductive stack including a conductive adhesive and a conductive platform interposed between the first power electrode and the interior surface of the conductive clip.

In a package according to the first embodiment of the present invention, the conductive platform is attached to the first power electrode and the conductive adhesive is interposed between the interior surface of the clip and the platform.

In a package according to the second embodiment of the present invention, the conductive platform is attached to the interior surface of the clip and the conductive adhesive is interposed between the platform and the first power electrode.

Other features and advantages of the present invention will become apparent from the following description of the invention which refers to the accompanying drawings.

DETAILED DESCRIPTION OF THE EMBODIMENTS

Figure 1:
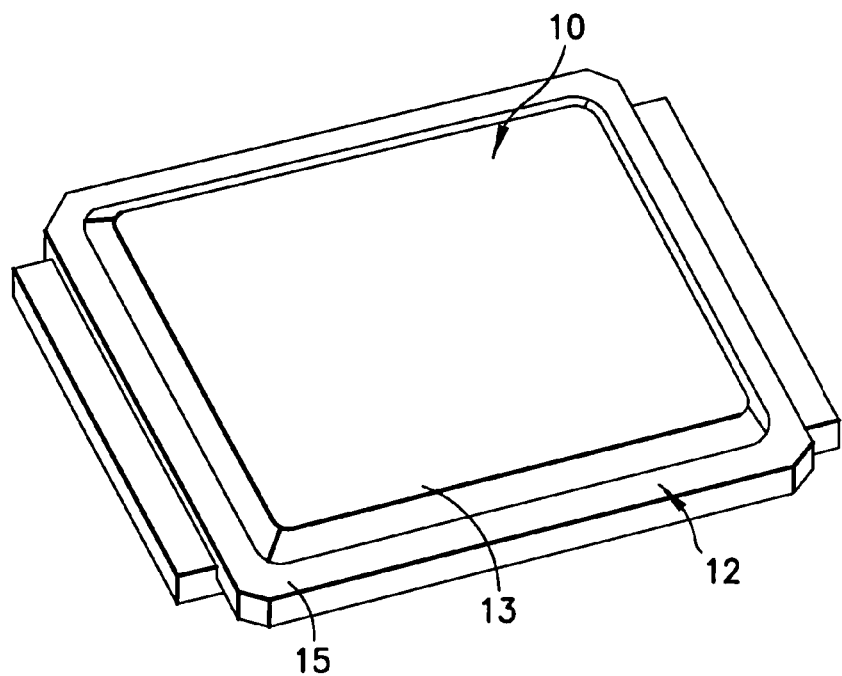
FIG. 1 is a perspective view of a package according to prior art.
Figure 2:
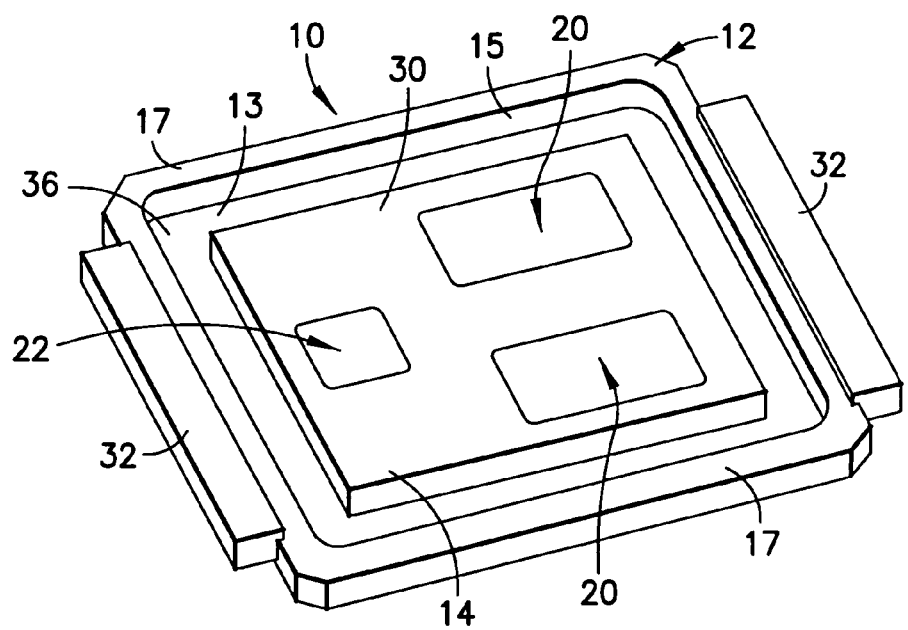
FIG. 2 is another perspective view of the package of FIG. 1.
Figure 3:
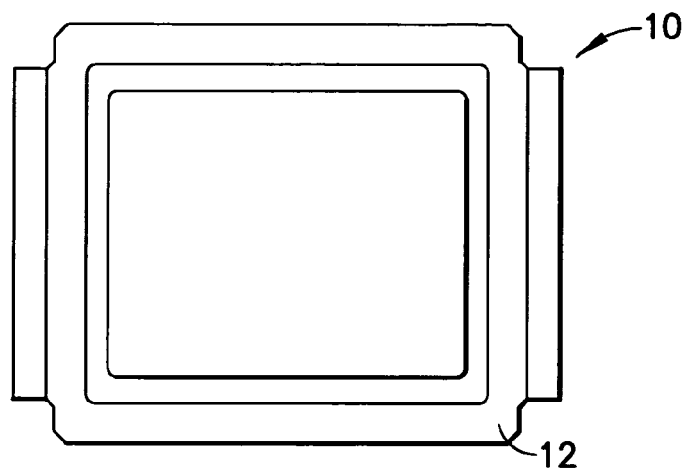
FIG. 3 is a top plan view of the package of FIG. 1.
Figure 4:
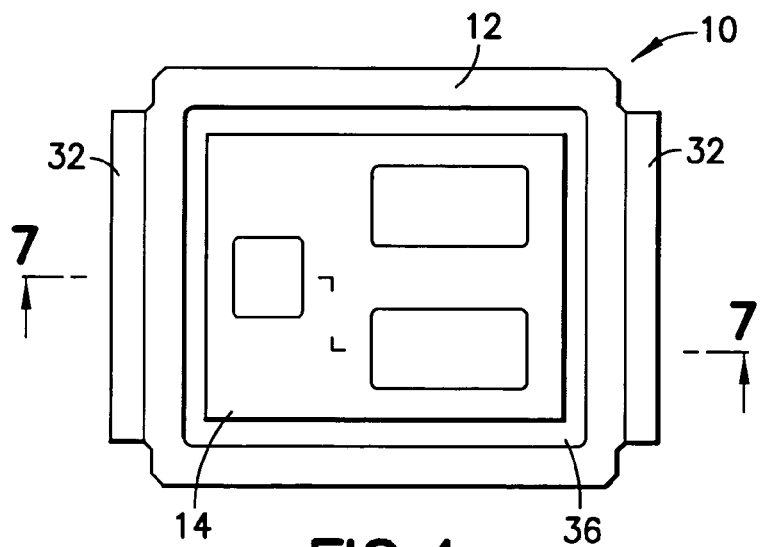
FIG. 4 is a bottom plan view of the package of FIG. 1.
Figure 6:
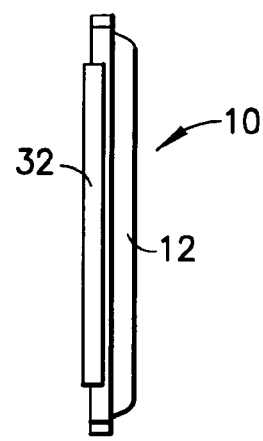
FIG. 6 is a side elevational view of the package of FIG. 1.
Figure 5:
FIG. 5 is a side elevational view of the package of FIG. 1.
Figure 7:
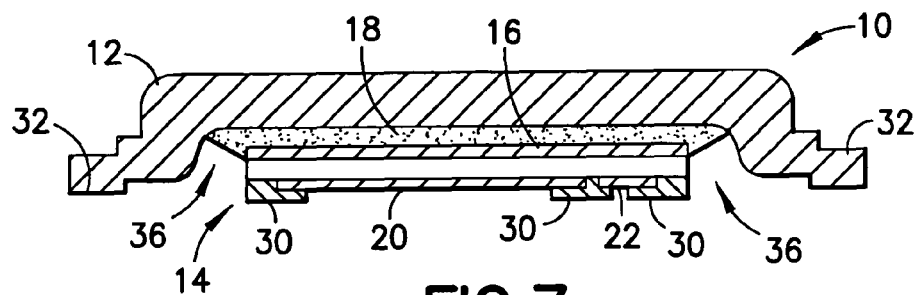
FIG. 7 is a cross-sectional view of the package of FIG. 1 along line 7-7 in FIG. 4.
Figure 8:
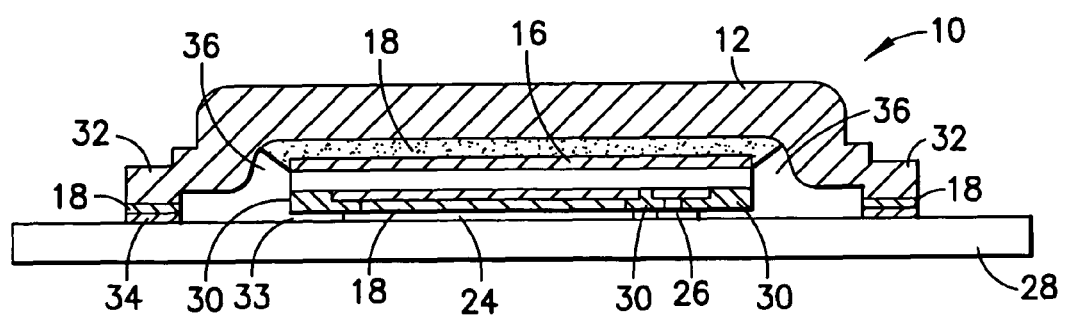
FIG. 8 shows the package of FIG. 1 as assembled on a circuit board.
Figure 9:
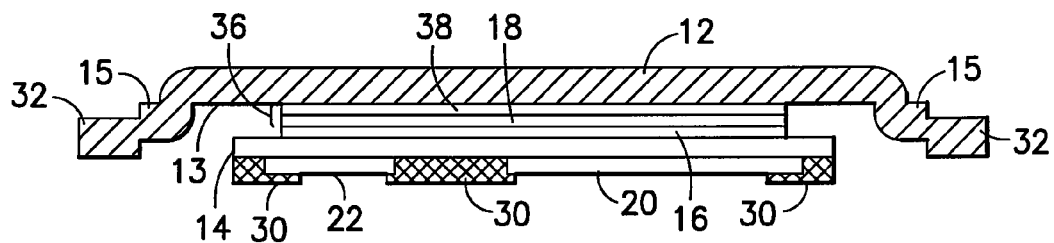
FIG. 9 illustrates a cross-sectional view of a package according to one embodiment of the present invention.

Referring to FIG. 9, a package according to the first embodiment of the present invention includes a conductive can 12, which is similar to can 12 of prior art package 10, and a power semiconductor die 14. Can 12 is typically formed with an electrically conductive material such as copper or a copper-based alloy, and may be coated with silver, gold or the like. Die 14 may be a vertical conduction type power semiconductor MOSFET having a drain electrode 16, a source electrode 20 and gate electrode 22. Source electrode 20, and gate electrode 22 of die 14 (which are disposed on a surface opposite to the drain electrode 16) each may include a solderable body which facilitates its direct connection to a respective conductive pad 24, 26 of a circuit board 28 by a conductive adhesive (e.g. solder or conductive epoxy) as illustrated by FIG. 8. Die 14 further includes passivation body 30 which partially covers source electrode 20 and gate electrode 22, but includes openings to allow access at least to the solderable portions thereof for electrical connection. Conductive can 12 includes web portion 13 (to which die 14 is electrically and mechanically connected), wall 15 surrounding web portion 13, and two oppositely disposed rails 32 extending from wall 15 each configured for connection to a respective conductive pad 34 on a circuit board 28 (see FIG. 8). Note that die 14 is spaced from wall 15 of can 12.

Referring to FIG. 9, according to the present invention, a conductive stack 36 is interposed between drain electrode 16 and the interior surface of conductive can 12. Conductive stack 36 includes a conductive platform 38, and a conductive adhesive body 18 such as solder or conductive epoxy. In a package according to the first embodiment of the present invention, conductive platform 38 is formed on the interior surface of can 12 while conductive adhesive body 18 is formed on drain electrode 16, and thus between platform 38 and drain electrode 16.

Figure 10:
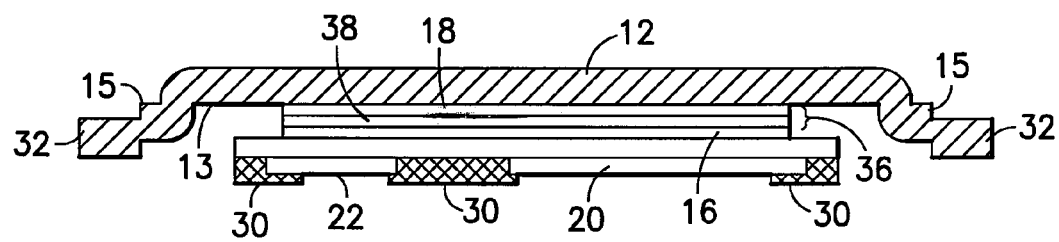
FIG. 10 illustrates a cross-sectional view of a package according to another embodiment of the present invention.

Referring to FIG. 10, in a package according to the second embodiment of the present invention, stack 36 includes a platform 38 formed on drain electrode 16 and conductive adhesive body 18 is interposed between the interior surface of can 12 and platform 38.

Figure 11:
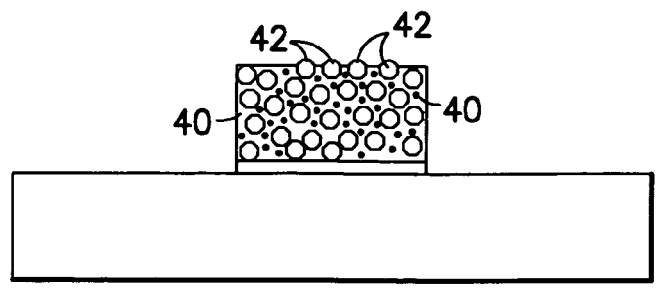
FIG. 11 illustrates a paste compound (as deposited on a support body) used to form a platform in a package according to the preferred embodiment of the present invention prior to heat treatment.
Figure 12:
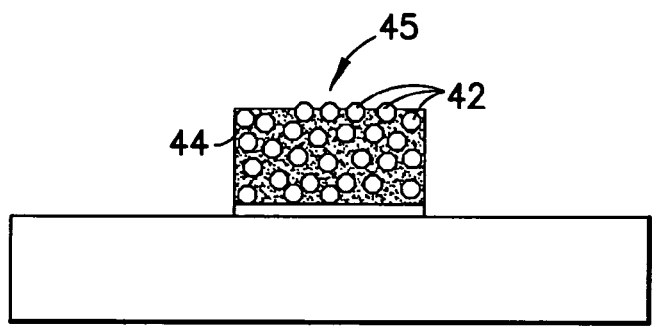
FIG. 12 illustrates a paste compound (as deposited on a support body) used to form a platform in a package according to the preferred embodiment of the present invention after heat treatment.

Platform 38 is preferably formed with a paste compound such as the one disclosed in U.S. patent application Ser. No. 10/970,165. Referring to FIG. 11, preferably, the paste compound is a mixture of binder particles 40 and filler particles 42, and, where required, a flux material. Binder particles 40 melt at a lower temperature than filler particles 42. Furthermore, the respective proportion of binder particles 40 and filler particles 42 is such that when binder particles 40 are melted the shape of the paste compound as deposited does not change substantially, but there is enough to glue filler particles 42 to one another after the binder liquidous is cooled to form a matrix 44 in order to form a structure. A structure 45 so formed can serve as a platform 38.

In a preferred embodiment of the present invention, the binder particles are solder powder, and the filler particles are conductive particles dispersed throughout, or mixed in with the solder powder.

Filler particles 42 used in platform 38 are preferably spherically shaped, although other shapes such as cubes and parallelepipeds, or the like may also be used. It should be noted that the shape of filler particles 42 does not need to be perfect geometrically. That is, for example, a spherical shape as referred to herein need only be generally sphere-like rather than spherical perfectly to be within the present invention. Thus, the shape of filler particles 42 as described herein should not be understood to restrict the invention to perfect geometric shapes.

In the preferred embodiment, binder 40 has a high melting temperature. Solders formed from the combination of 95% Sn and 5%, Sb (by weight), or the combination of 95.5% Sn, 3.8% Ag, and 0.7% Cu (by weight) are examples of solders suitable to be used as binder material.

A suitable material for forming filler particles 42 is copper. Other suitable materials are nickel and tin-silver.

Figure 13:
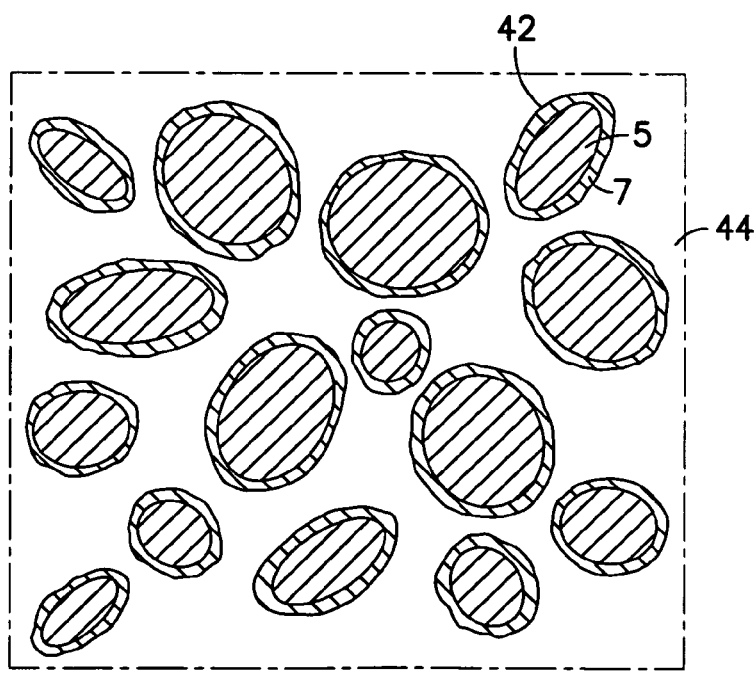
FIG. 13 illustrates the structure of a preferred paste compound after heat treatment.

Referring to FIG. 13, filler particles 42 may be formed of a core material 5 and coated with another material 7. For example, sphere-like copper particles may be plated with a nickel barrier and passivated with tin or silver. Suitable binder particles 40 to be used with sphere-like copper particles are tin-silver solders, high lead solders, or a tin-lead solder.

Sphere-like nickel particles, when used as conductive fillers, may be passivated with tin or silver. A suitable binder for fusing sphere-like nickel particles may be any one of the solders listed above.

A suitable binder for use with tin-silver filler particles may be a tin-bismuth solder.

In a preferred composition, fillers 42 may be spherical or sphere-like and may constitute 5-40% of the total weight of the mixture, and binder particles 40 may be solder in powder form and constitute 50-85% of the total weight of the mixture. In this preferred composition, about 10% of the total weight may be a solder flux which may be a resin with mild activation. Preferably, filler particles 42 are anywhere between 15 μm-65 μm and the particle size of solder binder may be anywhere between 25 μm-45 μm.

One specific example of the paste used in the present invention includes 31.5% (by weight) of silver coated nickel particles, 58.5% (by weight) of SAC (Tin-Silver-Copper) or SA (Tin-Silver) alloys as binder. The SAC composition may be 95.5% Sn, 3.8% Ag, and 0.7% Cu (by weight), while SA composition is 96% Sn and 4% Ag (by weight). In this example, 10% of the total weight may be flux material.

Another example may be a high flow derivative of the previous example having anti-slump properties. Such a paste may include 5% (by weight) of silver coated nickel spheres, 85% SAC or SA, and 10% (by weight) of flux.

A paste compound as described above is particularly useful for forming relatively flat large area platforms 38 on surfaces, such as the interior surface of can 12, or an electrode of a semiconductor die 14.

Generally, a process for manufacturing platform 38 involves depositing an amount of the paste compound on a surface. Specifically, for example, a desired amount of the paste may be deposited over in the interior of can 12 or on drain electrode 16 of a MOSFET die. In the preferred embodiment, the paste may be deposited using a stenciling or printing method, although other methods of deposit are considered within the invention.

After depositing the paste, heat is applied to cause binder particles 40 to melt. Thus, if solder is used as a binder, heat is applied until the solder is reflown, i.e. the solder is taken to its reflow temperature. Since, the binder particles have a much lower melting temperature than filler particles 42, filler particles 42 remain solid. However, binder particles 40 melt and wet filler particles 42. Once the temperature is lowered below the melting temperature of binder particles 40, filler particles 42 are "glued" to one another, thereby forming an integral structure as shown in FIG. 11.

Preferably, the proportion of the binder particles is so selected that there will not be enough liquidous to flow, but there will be enough liquidous to glue filler particles 42 together to form an integral structure suitable to serve as platform 38.

Figure 14:
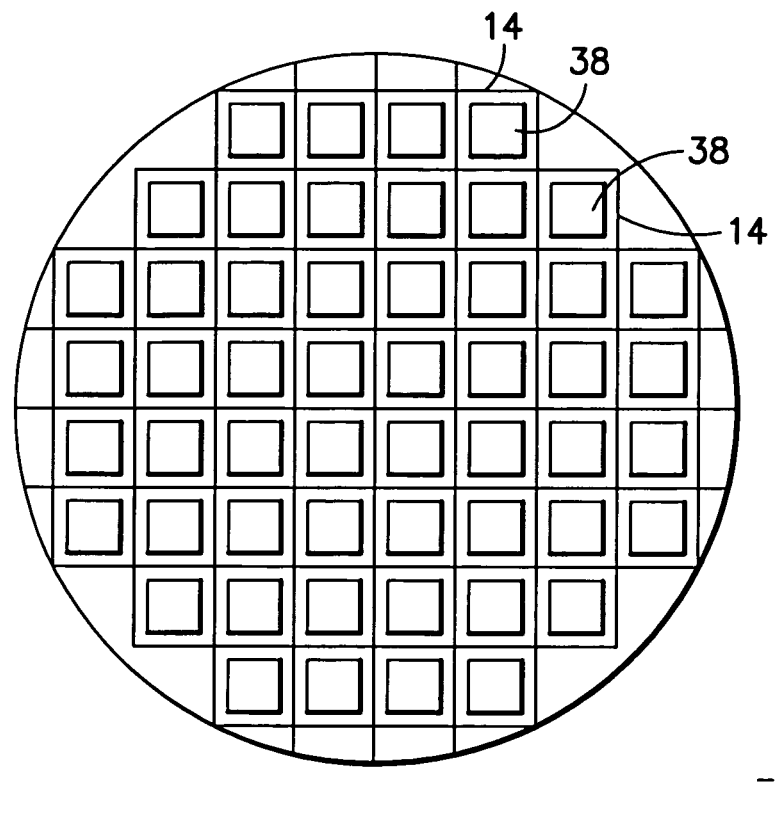
FIG. 14 shows a top plan view of a wafer containing semiconductor die processed for a package according to the second embodiment.
Figure 15:
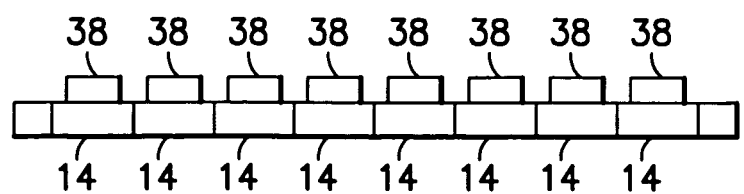
FIG. 15 shows a side plan view of a wafer shown in FIG. 5 as seen in the direction of the arrows 6-6.

To fabricate a package according to the second embodiment as illustrated by FIG. 10, a platform 38 is formed on drain electrode 16 of a die 14 while die 14 is still part of wafer 44 as seen in FIG. 14. To form platforms 38, the paste may be deposited in any known manner, for example, stenciling, printing, jet spraying or the like. Next, each die 14 is singulated and placed inside a respective can 12 and attached to the same by a respective conductive adhesive body 18. Alternatively, each die 14 may be first singulated and then a platform 38 can be formed on a selected electrode thereof.

The second method may not be desirable if the wafer carrier is rated below the reflow temperature of the paste in that paste compound may need to be reflown before the die are singulated. In such a case the first method may be desirable in that can 12 may not be limited to the reflow temperature of the paste compound.

A platform according to the present invention is beneficial in that it provides the standoff that is necessary to accommodate a thin die and may also provide additional thermal capacitance.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package, comprising:
   a die comprising a first electrode disposed on a first surface thereof and a second electrode disposed on an opposite surface thereof;
   a conductive clip having a web portion and an interior deeper than a thickness of said die;
   a conductive stack attaching said first electrode to said web portion, said conductive stack comprising a conductive adhesive and a conductive platform, and said second electrode not disposed within said interior;
   wherein said conductive platform provides a standoff for said die such that said second electrode protrudes from said conductive clip.

2. The semiconductor package of claim 1, wherein said conductive clip further comprises a wall surrounding said web portion, and a rail extending from said wall.

3. The semiconductor package of claim 1, wherein said conductive platform is formed on said web portion, and said conductive adhesive is formed on said first electrode.

4. The semiconductor package of claim 1, wherein said conductive platform is formed on said first electrode, and said conductive adhesive is interposed between said conductive platform and said web portion.

5. The semiconductor package of claim 1, wherein said conductive platform is formed with a paste compound.

6. The semiconductor package of claim 5, wherein a shape of said paste compound does not substantially change when said conductive platform is heated.

7. The semiconductor device of claim 5, wherein said paste compound comprises a mixture of binder particles and filler particles.

8. The semiconductor package of claim 7, wherein said binder particles comprise solder powder, and said filler particles comprise conductive particles.

9. The semiconductor package of claim 7, wherein said filler particles constitute 5-40% by weight of said paste compound, and said binder particles constitute 50-85% by weight of said paste compound.

10. The semiconductor package of claim 7, wherein said filler particles are between 15-65 μm and said binder particles are between 25-45 μm.

11. The semiconductor package of claim 7, wherein said filler particles comprise a core material coated with another material.

12. The semiconductor package of claim 7, wherein said binder particles comprise at least 95% Sn by weight.

13. The semiconductor package of claim 7, wherein said binder particles form a solder matrix that glues said filler particles to one another.

14. A semiconductor package, comprising:
    a die comprising a drain electrode disposed on a first surface thereof and a source electrode disposed on an opposite surface thereof;
    a conductive clip having a web portion and an interior deeper than a thickness of said die, said conductive clip comprising a wall surrounding said web portion, and a rail extending from said wall; and
    a conductive stack attaching said drain electrode to said web portion, said conductive stack comprising a conductive adhesive and a conductive platform, said source electrode not disposed within said interior;
    wherein said conductive platform provides a standoff for said die such that said source electrode protrudes from said conductive clip.

15. The semiconductor package of claim 14, wherein said conductive clip is can-shaped.

16. The semiconductor package of claim 14, wherein said conductive clip is comprised of copper.

17. The semiconductor package of claim 14, wherein said conductive platform is formed on said web portion, and said conductive adhesive is formed on said drain electrode.

18. The semiconductor package of claim 14, wherein said conductive platform is formed on said drain electrode, and said conductive adhesive is interposed between said conductive platform and said web portion.

19. The semiconductor package of claim 14, wherein said conductive platform is comprised of conductive particles glued to one another by a solder matrix.

* * * * *